(12) United States Patent
Ahn

(10) Patent No.: US 8,524,517 B2
(45) Date of Patent: Sep. 3, 2013

(54) COPPER BLEND I-VII COMPOUND SEMICONDUCTOR LIGHT-EMITTING DEVICES

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 32 days.

(21) Appl. No.: 13/279,945

(22) Filed: Oct. 24, 2011

(65) Prior Publication Data

US 2012/0040483 A1 Feb. 16, 2012

Related U.S. Application Data

(63) Continuation of application No. 12/620,602, filed on Nov. 18, 2009, now Pat. No. 8,058,641.

(51) Int. Cl.
*H01L 21/00* (2006.01)

(52) U.S. Cl.
USPC ............... 438/46; 438/47; 257/43; 257/79; 257/85; 257/94; 257/96

(58) Field of Classification Search
None
See application file for complete search history.

(56) References Cited

U.S. PATENT DOCUMENTS

| | | | |
|---|---|---|---|
| 3,920,860 A | 11/1975 | Freller et al. | |
| 3,990,096 A | 11/1976 | Namizaki et al. | |
| 4,764,261 A | 8/1988 | Ondris et al. | |
| 5,079,774 A | 1/1992 | Mendez et al. | |
| 5,112,410 A | 5/1992 | Chen | |
| 5,175,739 A | 12/1992 | Takeuchi et al. | |
| 5,181,219 A | 1/1993 | Mori et al. | |
| 5,181,221 A | 1/1993 | Mori et al. | |
| 5,182,757 A | 1/1993 | Mori et al. | |
| 5,287,377 A | 2/1994 | Fukuzawa et al. | |
| 5,291,507 A | 3/1994 | Haase et al. | |
| 5,295,148 A | 3/1994 | Mori et al. | |
| 5,317,584 A | 5/1994 | Mori et al. | |
| 5,404,027 A | 4/1995 | Haase et al. | |
| 5,404,369 A | 4/1995 | Mori et al. | |
| 5,490,953 A | 2/1996 | Morita | |
| 5,563,902 A | 10/1996 | Xu et al. | |
| 5,606,176 A | 2/1997 | Nitta | |
| 5,646,419 A | 7/1997 | McCaldin et al. | |
| 5,818,072 A | 10/1998 | Schetzina | |
| 5,933,444 A | 8/1999 | Molva et al. | |
| 6,069,380 A | 5/2000 | Chou et al. | |
| 6,515,313 B1 | 2/2003 | Ibbetson et al. | |
| 6,627,914 B1 | 9/2003 | Komiyama et al. | |
| 6,798,552 B2 | 9/2004 | Tada | |

(Continued)

FOREIGN PATENT DOCUMENTS

| | | | |
|---|---|---|---|
| JP | 7202340 A | 8/1995 | |
| JP | 9199783 A | 7/1997 | |

(Continued)

OTHER PUBLICATIONS

II-VI solar cells moving to the production phase, Photovoltaics Bulletin, (2003), vol. 2003, No. 11, Nov. 2003, pp. 10-12.

(Continued)

*Primary Examiner* — Fei Fei Yeung Lopez

(57) ABSTRACT

Implementations and techniques for semiconductor light-emitting devices including one or more copper blend I-VII compound semiconductor material barrier layers are generally disclosed.

12 Claims, 5 Drawing Sheets

(56) References Cited

U.S. PATENT DOCUMENTS

| | | | |
|---|---|---|---|
| 6,803,596 B2 * | 10/2004 | Hata | 257/13 |
| 6,813,063 B2 | 11/2004 | Ishihara | |
| 6,891,329 B2 | 5/2005 | Nagano et al. | |
| 7,420,225 B1 | 9/2008 | Wanke et al. | |
| 7,638,817 B2 | 12/2009 | Shur et al. | |
| 2002/0031153 A1 | 3/2002 | Niwa et al. | |
| 2002/0150135 A1 | 10/2002 | Naone et al. | |
| 2004/0058467 A1 | 3/2004 | Chirovsky et al. | |
| 2004/0095978 A1 | 5/2004 | Cheng et al. | |
| 2004/0183087 A1 | 9/2004 | Gardner | |
| 2004/0232412 A1 | 11/2004 | Burgener, II et al. | |
| 2005/0074576 A1 | 4/2005 | Chaiken et al. | |
| 2005/0185686 A1 | 8/2005 | Rupasov et al. | |
| 2005/0285128 A1 | 12/2005 | Scherer et al. | |
| 2006/0244003 A1 | 11/2006 | Ueda et al. | |
| 2007/0063304 A1 | 3/2007 | Matsumoto et al. | |
| 2007/0126021 A1 | 6/2007 | Ryu et al. | |
| 2007/0126037 A1 | 6/2007 | Ikeda | |
| 2007/0194297 A1 | 8/2007 | McCarthy et al. | |
| 2007/0298551 A1 | 12/2007 | Bouvet et al. | |
| 2008/0048193 A1 | 2/2008 | Yoo et al. | |
| 2008/0197366 A1 | 8/2008 | Yoo et al. | |
| 2009/0017268 A1 | 1/2009 | Skipor et al. | |
| 2009/0020149 A1 | 1/2009 | Woods et al. | |
| 2009/0106583 A1 | 4/2009 | Kawamura | |
| 2009/0114940 A1 | 5/2009 | Yang et al. | |
| 2009/0121628 A1 | 5/2009 | Cho et al. | |
| 2009/0220017 A1 | 9/2009 | Kawamura | |
| 2009/0273820 A1 | 11/2009 | Dionne et al. | |
| 2009/0310640 A1 | 12/2009 | Sato et al. | |
| 2010/0096001 A1 | 4/2010 | Sivananthan et al. | |
| 2010/0155696 A1 | 6/2010 | Duan et al. | |
| 2010/0261338 A1 | 10/2010 | Tsakalakos et al. | |
| 2010/0276661 A1 | 11/2010 | Ahn | |
| 2010/0301308 A1 | 12/2010 | Ahn | |
| 2010/0301454 A1 | 12/2010 | Zhang et al. | |
| 2010/0326489 A1 | 12/2010 | Ahn | |
| 2011/0001121 A1 | 1/2011 | Ahn | |
| 2011/0001122 A1 | 1/2011 | Ahn | |
| 2011/0001124 A1 | 1/2011 | Ahn | |
| 2011/0001125 A1 | 1/2011 | Ahn | |
| 2011/0043884 A1 | 2/2011 | Ahn | |
| 2011/0095309 A1 | 4/2011 | Ahn | |
| 2011/0114995 A1 | 5/2011 | Ahn | |

FOREIGN PATENT DOCUMENTS

| | | |
|---|---|---|
| WO | 2009067347 A1 | 5/2009 |
| WO | 2009106583 A1 | 9/2009 |
| WO | 2010137865 A1 | 12/2010 |
| WO | 2011004990 A1 | 1/2011 |

OTHER PUBLICATIONS

Ahn, D., Theory of Non-Markovian Gain in Strained-Layer Quantum-Well Lasers with Many-Body Effects, IEEE Journal of Quantum Electronics, Feb. 1998, vol. 34, Issue 2, pp. 344-352.

Ahn, D., Time-convolutionless reduced-density-operator theory of an arbitrary driven system coupled to a stochastic reservoir. II. Optical gain and line-shape function of a driven semiconductor, Physical Review B, 1995, vol. 51, No. 4, pp. 2159-2166.

Ahn, D., Time-convolutionless reduced-density-operator theory of an arbitrary driven system coupled to a stochastic reservoir: Quantum kinetic equations for semiconductors, Physical Review B, vol. 50, No. 12, 1994, pp. 8310-8318.

Ahn, D., and Chuang, S. L., A field-effect quantum-well laser with lateral current injection, Journal of Applied Physics, vol. 64, Issue 1, Jul. 1, 1988, pp. 440-442.

Ahn, D., and Chuang, S. L., Electric field dependence of intrasubband polar-optical-phonon scattering in a quantum well, Physical Review B, vol. 37, No. 5, 1988, pp. 2529-2535.

Ahn, D., et al., Non-Markovian Gain of Strained-Layer Wurtzite GaN Quantum-Well Lasers with Many-Body Effects, IEEE Journal of Selected Topics in Quantum Electronics, May/Jun. 1998, vol. 4, Issue 3, pp. 520-526, pp. 520-526.

Ahn, D., et al., Optical gain and luminescence of a ZnO-MgZnO quantum well, IEEE Photonics Technology Letters, 2006, vol. 18, Issue 2, pp. 349-351.

Alda, J., et al., Optical antennas for nano-photonic applications, Nanotechnology, 2005, vol. 16, Issue 5, pp. S230-S234.

Angelakis, D. G., et al., Photon-blockade-induced Mott transitions and XY spin models in coupled cavity arrays, Physical Review A, 2007, vol. 76, pp. 031805-1-031805-4.

Bai, S., et al, Determination of the electric field in 4H/3C/4H-SiC quantum wells due to spontaneous polarization in the 4H SiC matrix, Applied Physics Letters, Oct. 13, 2003, vol. 83, Issue 15, pp. 3171-3173.

Bandara, S. V., et al., Quantum Well Infrared Photodetectors for Long Wavelength Infrared Applications, Proceedings of SPIE, 1998, vol. 3436, Infrared Technology and Applications XXIV, pp. 280-284.

Bozhevolnyi, S. I., et al., Channel Plasmon-Polariton Guiding by Subwavelength Metal Grooves, Physical Review Letters, vol. 95, 046802, Jul. 22, 2005, pp. 046802-1-046802-4.

Bradley, I.V., et al., Space-charge effects in type-II strained layer superlattices, Journal of Crystal Growth, 1998, vol. 184-185, pp. 728-731.

Chu, T.L., and Chu, S.S., Thin film II-VI photovoltaics, vol. 38, Issue 3, Mar. 1995, pp. 533-549.

Compaan, A. D., et al., Sputtered II-VI Alloys and Structures for Tandem PV, Subcontract Report NREL/SR-520- 43954, Sep. 2008, pp. 1-64.

Goosen, K.W., Excitonic electroabsorption in extremely shallow quantum wells, Applied Physics Letters, Dec. 10, 1990, vol. 57, Issue 24, pp. 2582-2584.

Greentree, A.D., et al., Quantum phase transitions of light, Nature Physics, 2006, vol. 2, pp. 856-861.

Hartmann, M.J., and Plenio, M.B., Strong Photon Nonlinearities and Photonic Mott Insulators, Physical Review Letters, vol. 99, Issue 10, Sep. 7, 2007, pp. 103601-1 to 103601-4.

Hernández, F. E. et al., High Performance Optical Limiter, LEOS newsletter, vol. 14, No. 6, Dec. 2000, accessed online on Oct. 22, 2012 via http://photonicssociety.org/newsletters/dec00/high.htm.

Hetterich, J., et al., Optimized Design of Plasmonic MSM Photodetector, IEEE Journal of Quantum Electronics, Oct. 2007, vol. 43, Issue 10, pp. 855-859.

Hoang, T. et al., A high efficiency lateral light emitting device on SOI, 12th International Symposium on Electron Devices for Microwave and Optoelectronic Applications, EDMO 2004, Nov. 8-9, 2004, pp. 87-91.

Huh, C., et al., Improvement in light-output efficiency of InGaN/GaN multiple-quantum well light-emitting diodes by current blocking layer, Journal of Applied Physics, vol. 92, Issue 5, Sep. 1, 2002, pp. 2248-2250, American Institute of Physics.

Jeon, S.-R., et al., GaN tunnel junction as a current aperture in a blue surface-emitting light-emitting diode, Applied Physics Letters, vol. 80, Issue 11, Mar. 18, 2002, 1933-1935.

Jeon, S.-R., et al., Lateral current spreading in GaN-based light-emitting diodes utilizing tunnel contact junctions, Applied Physics Letters, vol. 78, No. 21, May 21, 2001, 3265-3267.

Jia, A., et al., Design of new UV/blue/green light emitters made of hexagonal-phase ZnMgCdOSSe mixed-crystal system fabricated on GaAs- and InP-(1 1 1) substrates, Journal of Crystal Growth, 2000, vol. 214-215, Issue 1, pp. 1085-1090.

Jin, S. X., et al., Size dependence of III-nitride microdisk light-emitting diode characteristics, Applied Physics Letters, May 28, 2001, vol. 78, No. 22, pp. 3532-3534.

Kim, H., et al., Lateral current transport path, a model for GaN-based light-emitting diodes: application to practical device designs, Applied Physics Letters, vol. 81, Issue 7, Aug. 12, 2002, 1326-1328, American Institute of Physics.

Klimov, V.I., et al., Optical Gain and Stimulated Emission in Nanocrystal Quantum Dots, Science, Oct. 13, 2000, vol. 290, No. 5490, pp. 314-317.

Kuznetsov, P.I., et al., Hexagonal ZnCdS epilayers and CdSSe/ZnCdS QW structures on CdS(0001) and ZnCdS (0001) substrates grown by MOVPE, Physica E, Voume: 17, 2003, pp. 516-517.

LEDs Magazine, Goldeneye sets brightness benchmark for green LEDs, http://www.ledsmagazine.com/news/5/5/18, May 15, 2008, 2 pages.

Leosson, K., et al., Long-range surface plasmon polariton nanowire waveguides for device applications, Optics Express, vol. 14, No. 1, Jan. 9, 2006, pp. 314-319.

Little, R. B., et al., Formation of quantum-dot quantum-well heteronanostructures with large lattice mismatch: ZnS/CdS/ZnS, Journal of Chemical Physics, vol. 114, No. 4, 2001, pp. 1813-1822.

Liu, J., et al., AlGaN/GaN/InGaN/GaN DH-HEMTs With an InGaN Notch for Enhanced Carrier Confinement, IEEE Electron Device Letters, Jan. 2006, vol. 27, Issue 1, pp. 10-12.

Liu, L., et al., Novel surface plasmon waveguide for high integration, Optics Express, vol. 13, No. 17, Aug. 22, 2005 pp. 6645-6650.

Najeh, A.-S., Synthesis of CdSeS Nanocrystals in Coordinating and Noncoordinating Solvents: Solvent's Role in Evolution of the Optical and Structural Properties, Chemistry of Materials, Mar. 26, 2007, vol. 19, Issue 21, pp. 5185-5193.

Neogi, A., et al., Enhancement of spontaneous recombination rate in a quantum well by resonant surface plasmon coupling, Physical Review B, vol. 66 (2002) pp. 153305-1-153305-4.

Obloh, H., Group III-nitride based blue emitters, Advances in Solid State Physics, 1999, vol. 38, pp. 15-28.

Okamoto, K, et al., Surface-plasmon-enhanced light emitters based on InGaN quantum wells, Nature Materials, vol. 3, Sep. 2004, pp. 601-605.

Park, S.-H., Crystal orientation effects on electronic properties of wurtzite GaN/AlGaN quantum wells with spontaneous and piezoelectric polarization, Japanese Journal of Applied Physics, 2000, vol. 39, Issue 6A, pp. 3478-3482.

Park, S.-H., and Ahn, D., Spontaneous and piezoelectric polarization effects in wurtzite ZnO/MgZnO quantum well lasers, Applied Physics Letters, 2005, vol. 87, Issue 25, pp. 253509-1-253509-3.

Park, S.-H., and Chuang, S. L., Crystal-orientation effects on the piezoelectric field and electronic properties of strained wurtzite semiconductors, Physical Review B, 1999, vol. 59, Issue 7, pp. 4725-4737.

Park, S.-H., and Chuang, S.-L., Many-body optical gain of wurtzite GaN-based quantum-well lasers and comparison with experiment, Applied Physics Letters, vol. 72, Issue 3, Jan. 1998, pp. 287-289.

Park, S.-H., and Chuang, S.-L., Piezoelectric effects on electrical and optical properties of wurtzite GaN/AlGaN quantum well lasers, Applied Physics Letters, vol. 72, Issue 24, Jun. 1998, pp. 3103-3105.

Park, S.-H., et al., Many-body optical gain and intraband relaxation time of wurtzite InGaN/GaN quantum-well lasers and comparison with experiment, Applied Physics Letters, 2005, vol. 87, Issue 4, pp. 044103-1-044103-3.

Park, S.-H., et al., Optical gain in InGaN/InGaAlN quantum well structures with zero internal field, Applied Physics Letters, 2008, vol. 92, Issue 17, pp. 171115-1-171115-3.

Paschotta, R., Encyclopedia of Laser Physics and Technology, vol. 1 WileyVCH, 2008, ISBN 3527408282, 9783527408283 p. 595.

Ricker, T., Samsung's "world's smallest" 8.4 megapixel CMOS sensor: so long CCD?, accessed at http://www.engadget.com/http://www.engadget.com/2007/03/27/samsungs-worlds-smallest-8-4-megapixel-cmos-sensor-so-long/, Mar. 27, 2007, pp. 4.

Sargent, E.H., and Xu, J. M., Lateral Injection Lasers, International Journal of High Speed Electronics and Systems, Dec. 1998, vol. 9, Issue 4, pp. 941-978.

Shakya, J., et al., Switching characteristics of III-Nitride blue/green micro-LEDs, The Smithsonian/NASA Astrophysics Data System, American Physical Society, Annual March Meeting, Mar. 12-16, 2001.

Australian Patent Office, International Search Report and the Written Opinion of the International Searching Authority, Feb. 11, 2011, p. 1-8, Australia.

Park, Seoung-Hwan, et al., Internal field engineering in CdZnO/MgZnO quantum well structures, Applied Physics Letters, 2009, vol. 94, No. 083507, 1-3.

Park, Seoung-Hwan, et al., Optical gain in InGaN/InGaAlN quantum well structures with zero internal field, Applied Physics Letters, 2008, vol. 92, No. 171115, 1-3.

Williams, Stanley R., et al., Growth and luminescence spectroscopy of a CuCl quantum well structure, Journal of Vacuum Science and Technology A, 1988, vol. 6, No. 3, pp. 1950-1952.

Gogolin, O., et al., Temperature dependence of exciton peak energies in CuI quantum dots, Solid State Communications, 2002, vol. 122, pp. 511-513.

Valenta, J., et al., Hole-filling of persistent spectral holes in the excitonic absorption band of CuBr quantum dots, Applied Physics Letters, 1997, vol. 70, No. 6, pp. 680-682.

Masumoto, Yasuaki, et al., Observation of persistent spectral hole burning in CuBr quantum dots, Physical Review B, 1995, vol. 52, No. 7, pp. 4688-4691.

Kawazoe, Tadashi, et al., Luminescence Hole Burning and Quantum Size Effects of Charged Excitons in CuCl Quantum Dots, Physical Review Letters, 1996, vol. 77, No. 24, pp. 4942-4945.

Tassone, F., et al, Quantum-well reflectivity and exciton-polariton dispersion, Physical Review B, 1992, vol. 45, No. 11, pp. 6023-6030.

Andreani, Lucio Claudio, et al, Exchange interaction and polariton effects in quantum-well excitons, Physical Review B, 1990, vol. 41, No. 11, pp. 7536-7544.

SiliconFarEast.com, Lattice Constants, accessed at http://www.siliconfareast.com/lattice_constants.htm, pp. 2, accessed online Oct. 22, 2012.

Smith, S.J., et al., Lateral light emitting n-i-p diodes in InSb/AlxIn1-xSb quantum wells, Applied Physics Letters, vol. 89, p. 111118 (2006), 3 pages.

Taguchi, T., et al., Ultraviolet Laser and Photodetector of CdZnS/ZnS Multiple Quantum Wells, Physica B: Condensed Matter 1993, vol. 191, Issues: 1-2, pp. 136-139.

Ueno, J., et al., MBE growth of ZnSe/MgCdS and ZnCdS/MgCdS superlatttices for UV-A sensors, physica status solidi (c), Mar. 2006, vol. 3, Issue 4, pp. 1225-1228.

Ullrich, B., and Schroeder, R., Green emission and bandgap narrowing due to two-photon excitation in thin film CdS formed by spray pyrolysis, Semiconductor Science and Technology, Jun. 22, 2001, vol. 16, No. 8, pp. L37-L39.

Waltereit, P., et al., Nitride semiconductors free of electrostatic fields for efficient white light-emitting diodes, Nature, 2000, vol. 406, Issue 6798, pp. 865-868.

Wikipedia., Wurtzite crystal structure, accessed at http://en.wikipedia.org/wiki/Wurtzite_crystal_structure; pp. 2, Jan. 24, 2012.

Yeh, D-M., et al., Surface plasmon coupling effect in an InGaN/GaN single-quantum-well light-emitting diode, Applied Physics Letters, Oct. 23, 2007, vol. 91, Issue 17, pp. 171103-1 to 171103-3.

Yu, E. T., et al., Plasmonic Nanoparticle Scattering for Enhanced Performance of Photovoltaic and Photodetector Devices, Proceedings of SPIE, Aug. 28, 2008, vol. 7033, Plasmonics: Nanoimaging, Nanofabrication and their Applications IV, pp. 70331V-1 to 70331V-9.

Yu, T-H., and Brennan, K. F., Theoretical study of the two-dimensional electron mobility in strained III-nitride heterostructures, Journal of Applied Physics, Apr. 1, 2001, vol. 89, Issue 7, pp. 3827-3834.

Zhang, Y., and Singh, J., et al., Charge control and mobility studies for an AlGaN/GaN high electron mobility transistor, Journal of Applied Physics, vol. 85, Issue 1, Jan. 1, 1999, pp. 587-594.

International Search Report and Written Opinion for International Application No. PCT/KR2010/002649 mailed on Jul. 26, 2010.

International Search Report and Written Opinion for International Application No. PCT/KR2010/003322 mailed Aug. 10, 2010.

International Search Report and Written Opinion for International Application No. PCT/KR2010/004350 mailed on Sep. 10, 2010.

International Search Report and Written Opinion for International Application No. PCT/KR2010/005600 mailed on Oct. 22, 2010.

International Search Report and Written Opinion for International Application No. PCT/KR2010/007292 mailed on Jan. 26, 2011.

* cited by examiner

COPPER BLEND I-VII COMPOUND SEMICONDUCTOR LIGHT-EMITTING DEVICES

CROSS-REFERENCE TO RELATED APPLICATIONS

This application is a continuation of and claims priority to U.S. patent application Ser. No. 12/620,602, filed on Nov. 18, 2009 and entitled "Copper Blend I-VII Compound Semiconductor Light-Emitting Devices", the entire contents of which are incorporated herein by reference.

BACKGROUND

1. Technical Field

The present disclosure relates generally to a light-emitting device and, more specifically, a light emitting diode formed with an I-VII compound semiconductor.

2. Information

Semiconductor light-emitting devices, such as light-emitting diodes (LEDs) or laser diodes, may be used for various applications such as consumer electronics in which the semiconductor light-emitting devices form the light source, because of their generally long lifetime, low power requirements, and high reliability.

Among the LEDs, blue LEDs have attracted much attention lately as blue is one of the primary colors, and devices that produce full color displays using LEDs need to incorporate blue. Also, blue light's shorter wavelength allows it to be used to store more information on optical memory devices when compared to red or yellow light.

As the use of blue LEDs has increased, the demand for LEDs with higher quantum efficiencies, that is, the amount of light that can be produced from a given amount of electricity, or the need for new materials that may form high quantum efficiency light-emitting devices, has likewise increased.

DETAILED DESCRIPTION

Figure 1:
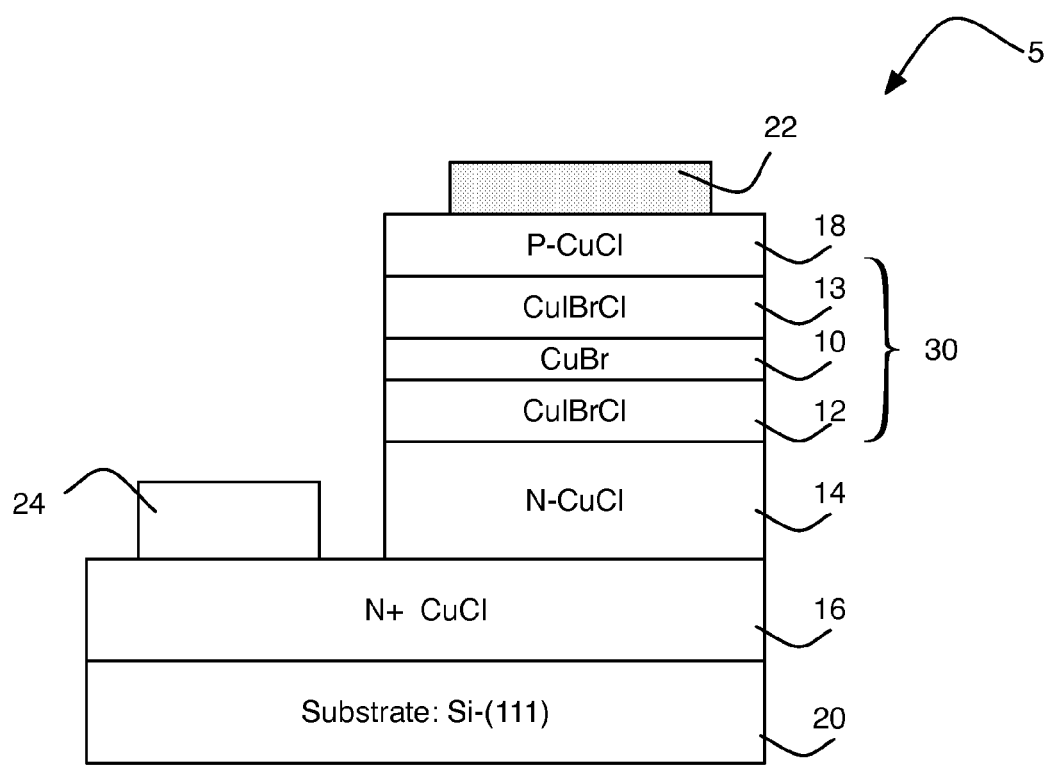
FIG. 1 shows a cross-sectional view of an illustrative embodiment of a light-emitting device arranged in accordance with the present disclosure.

The following description sets forth various examples along with specific details to provide a thorough understanding of claimed subject matter. It will be understood by those skilled in the art, however, that the claimed subject matter may be practiced without some or more of the specific details disclosed herein. Further, in some circumstances, well-known methods, procedures, systems, components and/or circuits have not been described in detail in order to avoid unnecessarily obscuring the claimed subject matter. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, may be arranged, substituted, combined, separated, and designed in a wide variety of different configurations, all of which are explicitly contemplated and make part of this disclosure.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, and so on, may be used to facilitate the discussion of the drawings and are not intended to restrict the application of claimed subject matter. Therefore, the following detailed description is not to be taken in a limiting sense and the scope of claimed subject matter defined by the appended claims and their equivalents.

This disclosure is drawn, inter alia, to methods, apparatus, and systems related to semiconductor light-emitting devices including one or more copper blend I-VII compound semiconductor material barrier layers.

In general, the color emitted by a light-emitting device such as a light-emitting diode or laser diode may be determined by the band gap of the semiconductor material from which it is formed. In particular, light in the green, blue, violet and ultraviolet (UV) portions of the electromagnetic spectrum has a higher energy than that of red or yellow light. Such high energy light may be generated using a semiconductor material having a wide band gap, that is, a band gap sufficient to create photons (the basic units of light) with a higher energy. The band gap, also called "an energy gap," generally refers to the energy difference between the top of the valence band and the bottom of the conduction band, and determines the energy released in the form of a photon when an electron releases energy as it drops from a higher orbital to a lower orbital during the electron-hole recombination process which may result in generation of light. A greater energy drop may release a higher-energy photon, e.g., light in the green, blue, or ultraviolet (UV) portions of the electromagnetic spectrum.

Group III nitrides such as GaN, as well as certain II-VI compounds such as ZnSe or ZnS are some examples of wide-band gap semiconductor materials capable of generating, for example, blue, green and/or UV high-energy light. The present disclosure contemplates the use of Group I-VII semiconductors that may replace such conventional wide-band gap semiconductor materials to form light-emitting devices.

FIG. 1 shows a cross-sectional view of an illustrative embodiment of a light-emitting device 5. As depicted, light-emitting device 5 may include a copper blend I-VII compound semiconductor light-emitting layer (an active layer) 10 disposed between an n-type region (a cathode) 14 and a p-type region (an anode) 18. Copper blend I-VII compound semiconductor light-emitting layer 10 may include a copper blend I-VII compound semiconductor such as copper(I) chloride (CuCl), copper(I) bromide (CuBr), copper(I) iodide (CuI) or combinations thereof. The band-gap energies of some of the copper blend I-VII compound semiconductors are shown in Table 1.

TABLE 1

|  | Lattice constant (Angstrom) | Band-gap energy (eV) |
| --- | --- | --- |
| CuCl | 5.42 | 3.399 |
| CuBr | 5.68 | 2.91 |
| CuI | 6.05 | 2.95 |

Such copper blend I-VII compound semiconductor light-emitting layers 10 may have a relatively large exciton binding energy, e.g., at least two times higher than those of Group III nitrides, which may improve the quantum efficiency. In particular, the I-VII compound semiconductors having a large exciton binding energy may be suitable for strong optical transitions desirable in light-emitting devices that emit light in, for example, the blue region of the visible spectrum. The exciton binding energy is a measure of the interaction of holes and electrons, which have opposite charges, and may be used to predict the strength of the hole-electron recombination process. For example, CuBr is known to have an exciton binding energy of about 108 meV, which is higher than that of ZnO. As a result, the I-VII compound semiconductor based light-emitting devices may be expected to have a larger optical gain than conventional wide band-gap semiconductors such as Group III nitrides or ZnO-based light-emitting devices.

However, these wide band-gap semiconductors including the I-VII compound semiconductors may exhibit characteristics such as piezoelectric polarization or spontaneous (voluntary) polarization. The piezoelectric polarization and the spontaneous polarization may be generated by a difference in polarization characteristics and a difference in lattice constant between the semiconductor thin films that form the light-emitting device. That is, light-emitting layers may have large internal fields due to the strain-induced piezoelectric effects resulting from interface stress between different kinds of layers. Also, the spontaneous polarization may be caused by, for example, the ionicity of the light-emitting layer itself.

Large internal fields may affect the optical electrical properties of the I-VII compound semiconductors, resulting in a large spatial separation between electrons and holes, thereby preventing efficient radiative recombination of holes and electrons to generate the desired light. Thus, to increase the internal efficiency in light-emitting devices formed with an I-VII semiconductor material, the internal field that may be present in copper blend I-VII compound semiconductor light-emitting layer 10 may need to be reduced.

In the case of a copper blend I-VII compound semiconductor light-emitting layer 10, such a copper blend I-VII compound semiconductor light-emitting layer 10 may be compressively strained to improve the optical gain, but the induced piezoelectric effects may reduce the optical gain in the absence of the internal polarization field reduction scheme. The control of the formation of the internal fields in the construction of a light-emitting device formed with I-VII compound semiconductor may lead to different characteristics that make light-emitting devices suitable for a wide variety of applications. The direction of the internal electrical fields may typically depend on the strain and the growth orientation. The total polarization in the light-emitting layer may be the sum of spontaneous polarization and piezoelectric polarization.

Referring again to FIG. 1, a first barrier layer 12 may be disposed between n-type region 14 and copper blend I-VII compound semiconductor light-emitting layer 10 to reduce the total polarization in the copper blend I-VII compound semiconductor light-emitting layer 10, which in turn decreases the internal fields in copper blend I-VII compound semiconductor light-emitting layer 10, thereby increasing the quantum efficiency of light-emitting device 5. Also, as depicted in FIG. 1, a second barrier layer 13 may be disposed between p-type region 18 and copper blend I-VII compound semiconductor light-emitting layer 10 to reduce the total polarization in copper blend I-VII compound semiconductor light-emitting layer 10.

According to one embodiment, first barrier layer 12 and/or second barrier layer 13 may be composed of a copper blend I-VII compound semiconductor material. For example, first barrier layer 12 and/or second barrier layer 13 may be composed of a quaternary material, e.g., a CuIBrCl-type copper blend I-VII compound semiconductor material. Alternatively, first barrier layer 12 and/or second barrier layer 13 may be composed of a ternary material, e.g., a CuICl-type copper blend I-VII compound semiconductor material.

According to one embodiment, first barrier layer 12 and/or second barrier layer 13 may have a material composition that causes a spontaneous polarization field and a piezoelectric polarization field in copper blend I-VII compound semiconductor light-emitting layer 10 to have opposite directions. The spontaneous polarization field and the piezoelectric polarization field in copper blend I-VII compound semiconductor light-emitting layer 10 may be arranged to have opposite directions by selecting certain compositions (e.g. mole fractions of the various components) that may reduce or cancel the internal field ("depolarization") in copper blend I-VII compound semiconductor light-emitting layer 10, generating a strain in copper blend I-VII compound semiconductor light-emitting layer 10.

By controlling the compositions (e.g. mole fractions of the various components) of first and/or second barrier layers 12, 13, the lattice constants of first and/or second barrier layers 12, 13 may also be controlled to reduce the spontaneous polarization. Additionally, the lattice constants of first and/or second barrier layers 12, 13 may be slightly smaller or greater than those of copper blend I-VII compound semiconductor light-emitting layer 10 to reduce the spontaneous polarization.

A more extensive discussion of the methods of selecting certain mole fractions to reduce or cancel the internal field in copper blend I-VII compound semiconductor light-emitting layer 10 and selecting certain mole fractions of first and/or second barrier layers 12, 13 to reduce the spontaneous polarization may be set forth in, for example, Park, Seoung-Hwan; Ahn, Doyeol; & Kim, Jong-Wook (2008, May 2), Optical gain in InGaN/InGaAlN quantum well structures, Applied Physics Letters, 92, 171115, and Park, Seoung-Hwan & Ahn, Doyeol (2009, Feb. 27), Internal field engineering in CdZnO/MgZnO quantum well structures, Applied Physics Letters, 94, 083507. The contents of both the above referenced publications are expressly incorporated by reference herein in their entirety. For example, such methods may be utilized to select certain mole fractions of first and/or second barrier layers 12, 13, which may include a CuIBrCl-type quaternary copper blend I-VII compound semiconductor material or a CuICl-type copper ternary copper blend I-VII compound semiconductor material.

As discussed above, the depolarization of an internal field may be due to the cancellation of the sum of piezoelectric and spontaneous polarizations of copper blend I-VII compound semiconductor light-emitting layer 10. As a result, the electric and optical properties of copper blend I-VII compound semiconductor light-emitting layer 10 may be improved, for example, by having a substantially reduced or substantially zero internal field. That is, light-emitting device 5 may have a large optical gain as a result of the enhancement of the optical matrix element due to the reduction or elimination of the internal field.

The strain in copper blend I-VII compound semiconductor light-emitting layer 10 may be compressive or tensile. In the compressive-strain case, copper blend I-VII compound semiconductor light-emitting layer 10 is laterally, i.e., in the plane of the wafer, compressed. In the tensile-strain case, copper blend I-VII compound semiconductor light-emitting layer 10 is expanded along the lateral direction. In some embodiments, the strain may be a tensile strain.

According to one embodiment, light-emitting device 5 may include at least one quantum well structure 30 composed by copper blend I-VII compound semiconductor light-emitting layer 10 and first and second barrier layers 12, 13. As is known, quantum well structure 30 may be formed by sandwiching a semiconductor thin layer between semiconductor layers of a wider band gap than that of the semiconductor thin layer. The semiconductor thin layer may be referred to as a "well layer," and the semiconductor layers of a wider band gap may be referred to as "barrier layers." A multi-quantum well structure may be formed by alternately laminating semiconductor layers of narrow and wide band gaps, such as by alternating copper blend I-VII compound semiconductor light-emitting layer 10 with first or second barrier layers 12, 13. In some embodiments, quantum well structure 30 may include three (3) or more quantum wells and, in some embodiments, five (5) to seven (7) quantum wells may be provided. The number of wells may be increased in order to increase the total power output of light-emitting device 5.

In some embodiments, the thickness of copper blend I-VII compound semiconductor light-emitting layer 10 may be about 10 to about 50 Angstroms. In certain embodiments, the thickness of copper blend I-VII compound semiconductor light-emitting layer 10 may be about 20 Angstroms and the thickness of first and/or second barrier layers 12, 13 may be about 100 Angstroms. The thickness of quantum well structure 30 may be from about 30 angstroms to about 250 angstroms. The mole fraction of the components in copper blend I-VII compound semiconductor light-emitting layer 10 or quantum well may be adjusted to achieve the desired wavelength emission of light-emitting device 5.

A more extensive discussion of the structure, quantum mechanics, and operation of the quantum well structures of light emitting devices may be set forth in, for example, E. Fred Schubert, Light-Emitting Diodes, $2^{nd}$ Edition (2006, Cambridge University Press), Sze, Physics of Semiconductor Materials, $2^{nd}$ Edition (1981, John Wiley & Sons, Inc), and Sze, Modern Semiconductor Device Physics (1998, John Wiley & Sons, Inc). These principles are generally well understood in this art and will not be repeated herein other than as necessary to explain and support the claimed subject matter.

In some embodiments, first barrier layer 12 and/or second barrier layer 13 and copper blend I-VII compound semiconductor light-emitting layer 10, i.e., a quantum well layer, may be undoped (i.e., not intentionally doped with impurities such as silicon or magnesium). In other embodiments, first and/or second barrier layers 12, 13 may be doped with impurities. For example, such impurities may include an n-type dopant, which may include zinc (Zn), magnesium (Mg), or the like; or may include a p-type dopant, which may include oxygen (O), sulfur (S), selenium (Se), or the like.

In some embodiments, n-type region 14 and/or p-type region 18 includes an I-VII compound semiconductor. For example, n-type region 14 may include n-CuCl, n-CuBr, or n-CuI, while p-type region 18 may include p-CuCl, p-CuBr, or p-CuI.

In some embodiment, as depicted in FIG. 1, n-type region 14 may be formed over a (111) surface of a substrate 20 formed of Si. Si, which is relatively inexpensive compared to the more expensive conventional substrate materials such as sapphire, may be used because its lattice constants are close to those of I-VII compound semiconductors that form copper blend I-VII compound semiconductor light-emitting layer 10 even though they may have different crystal structures. For example, Si is known to have a diamond structure while CuCl has a diamond structure. In particular, the (111) surface of the Si substrate 20 may be used to fabricate light-emitting device 5, as it may be suitable for the crystal structure of CuCl, which may be stacked on substrate 20. In other embodiments, substrate 20 may comprise sapphire, bulk gallium nitride, or the like.

In yet another embodiment, light-emitting device 5 additionally includes a transparent electrode 22 coupled to p-type region 18. Transparent electrode 22 may include, by way of example, indium tin oxide (e.g. a combination of indium (III) oxide ($In2O3$) and tin (IV) oxide ($SnO2$)), zinc oxide (ZnO), the like, and/or combinations thereof.

In some embodiments, light-emitting device 5 may include an n-type contact layer 16 disposed between substrate 20 and n-type region 14, and having an impurity concentration higher than that of n-type region 14. In some embodiments, n-type contact layer 16 includes an I-VII compound semiconductor. For example, n-type contact layer 16 may include n+CuCl, n+CuBr, or n+CuI.

Also, a metal electrode 24 may be coupled to n-type contact layer 16. Metal electrode 24 may be formed of, by way of example, a include aluminum, gold, platinum, silver, the like, and/or combinations thereof. Alternatively, metal electrode 24 may be coupled to n-type region 14. For example, metal electrode 24 may be coupled to n-type region 14 in cases where light-emitting device 5 may not include n-type contact layer 16.

As a result, in accordance with some embodiments of the present disclosure, light-emitting devices may be formed with an I-VII semiconductor with an internal field reduction scheme by controlling the compositions of the barrier layers. Because the internal field may be reduced or cancelled in copper blend I-VII compound semiconductor light-emitting layer 10, the spatial distance between electrons and holes may be reduced to improve the electron-hole recombination process. Therefore, emission of light having a higher energy may be achieved at high efficiency.

Figure 2:
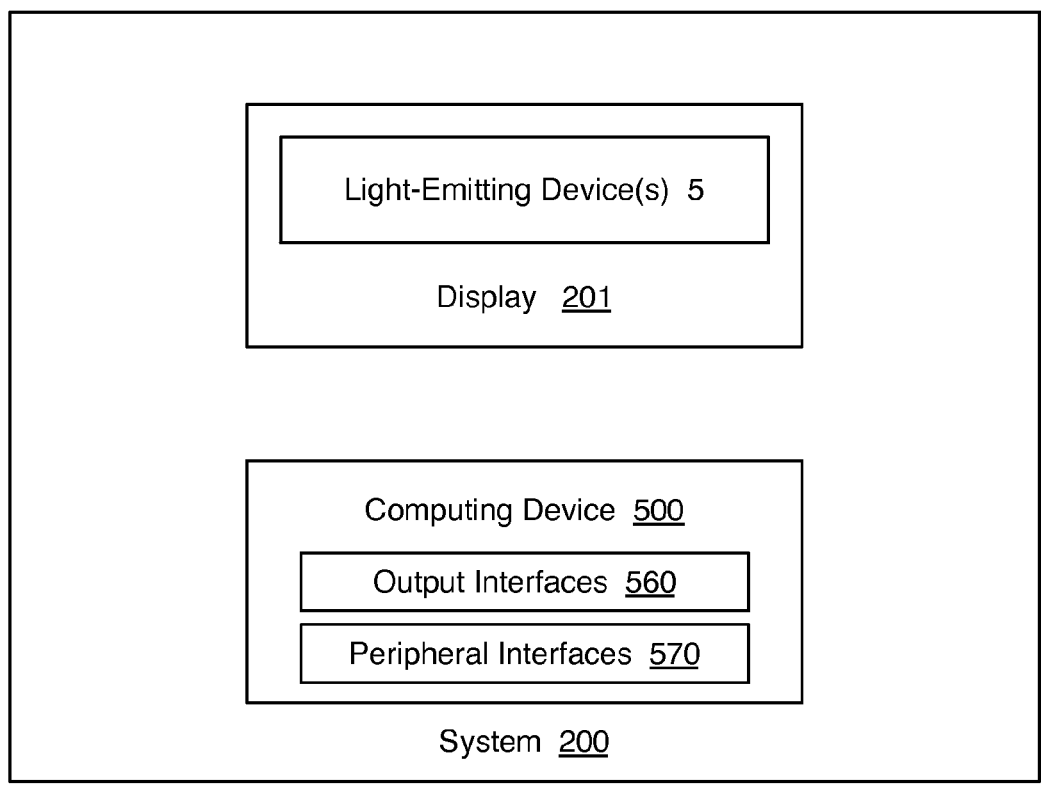
FIG. 2 illustrates a block diagram of a portion of an illustrative embodiment of a system arranged in accordance with the present disclosure.

FIG. 2 illustrates a block diagram of a portion of an illustrative embodiment of a system 200 in accordance with the disclosure. As depicted, system 200 may include a display 201 and a computing device 500. In one embodiment, display 201 and computing device 500 of system 200 may be implemented as a small-form factor portable (or mobile) electronic device such as a cell phone, a personal data assistant (PDA), a personal media player device, a wireless web-watch device, an application specific device, or a hybrid device that includes any of the above functions. System 200 may also be implemented as a personal computer including both laptop computer and non-laptop computer configurations.

In one embodiment, display 201 may include at least one light-emitting device 5 as described above with reference FIG. 1. Additionally, display 201 may include other forms of light-emitting devices in addition to light-emitting device 5.

As will be described in greater detail below with respect to FIG. 5, in one embodiment, computing device 500 may be capable of facilitating the use of system 200 and providing a user interface. Computing device 500 may, in one embodiment, be capable of facilitating the display of the user interface and interacting with display 201. For example, computing device 500 may facilitate communication via various interface devices (e.g., output interfaces 560, peripheral interfaces 570, communication interfaces, or the like). Example output interfaces 560 may be configured to communicate to various external devices including display 201. Example peripheral interfaces 570 may be configured to communicate with external devices included in and/or associated with display 201, such as touch input device for example. In one embodiment, such output interfaces 560 and/or peripheral interfaces 570 may be included within display 201.

Figure 3:
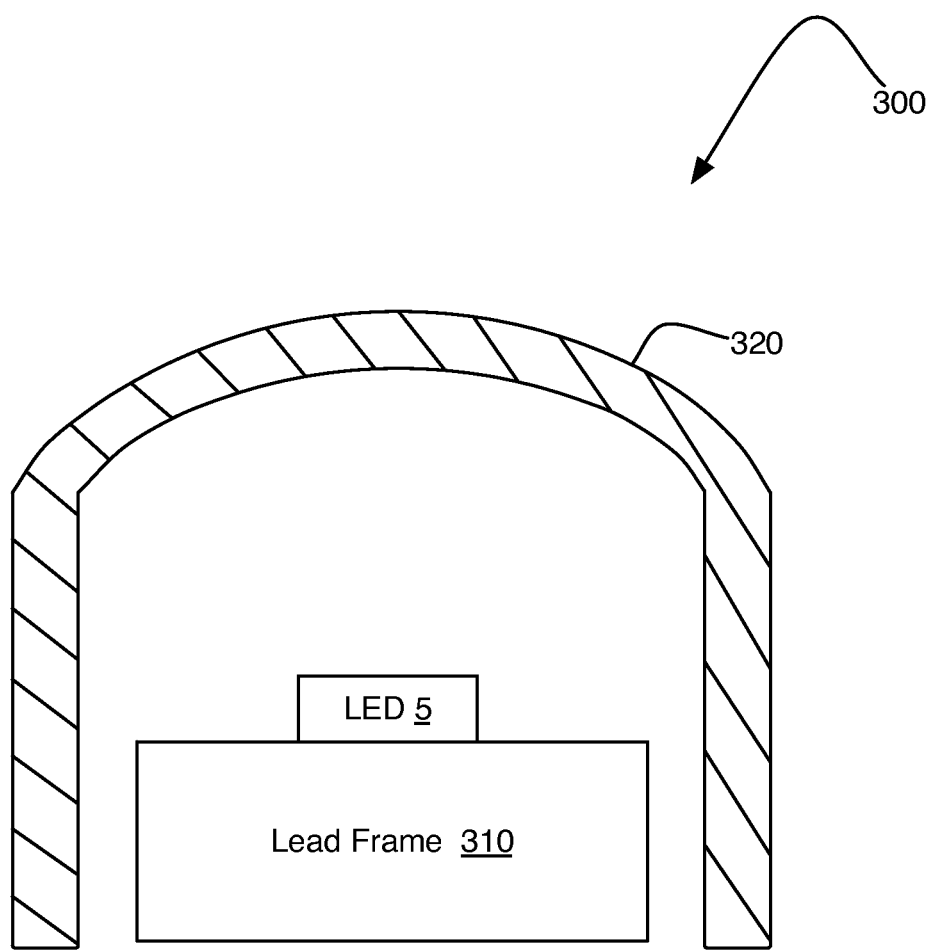
FIG. 3 shows a cross-sectional view of a portion of an illustrative embodiment of an LED package in accordance with the disclosure.

FIG. 3 shows a cross-sectional view of a portion of an illustrative embodiment of an LED package 300 in accordance with the disclosure. As depicted, LED package 300 may include light-emitting device 5 that may be mounted on a lead frame 310. LED package 300 may include an encapsulant 320 that may be oriented and arranged to encase or cover light-emitting device 5. LED package 300 may also be referred to as a "lamp," which may be energy efficient and environmentally friendly. LED package 300 may include through-hole-type packages, surface mount technology-type (SMT) packages, and/or the like.

Additionally or alternatively, some of the concepts discussed herein regarding LED package 300, light-emitting device 5, display 201 (FIG. 2), and/or system 200 (FIG. 2) may embody various types of optoelectronic devices including amplifiers, light-emitting diodes or edge emitting or surface emitting lasers that incorporate optical feedback to provide lasing action. For example, some of the concepts discussed herein regarding LED package 300, light-emitting device 5, display 201 (FIG. 2), and/or system 200 (FIG. 2) may find application in solid state lighting, solid state displays, lasers, light-emitting diodes (LEDs), biomedical therapy and diagnostic devices, medical lasers, eye surgery devices, DVD lasers, the like, and/or combinations thereof.

Figure 4:
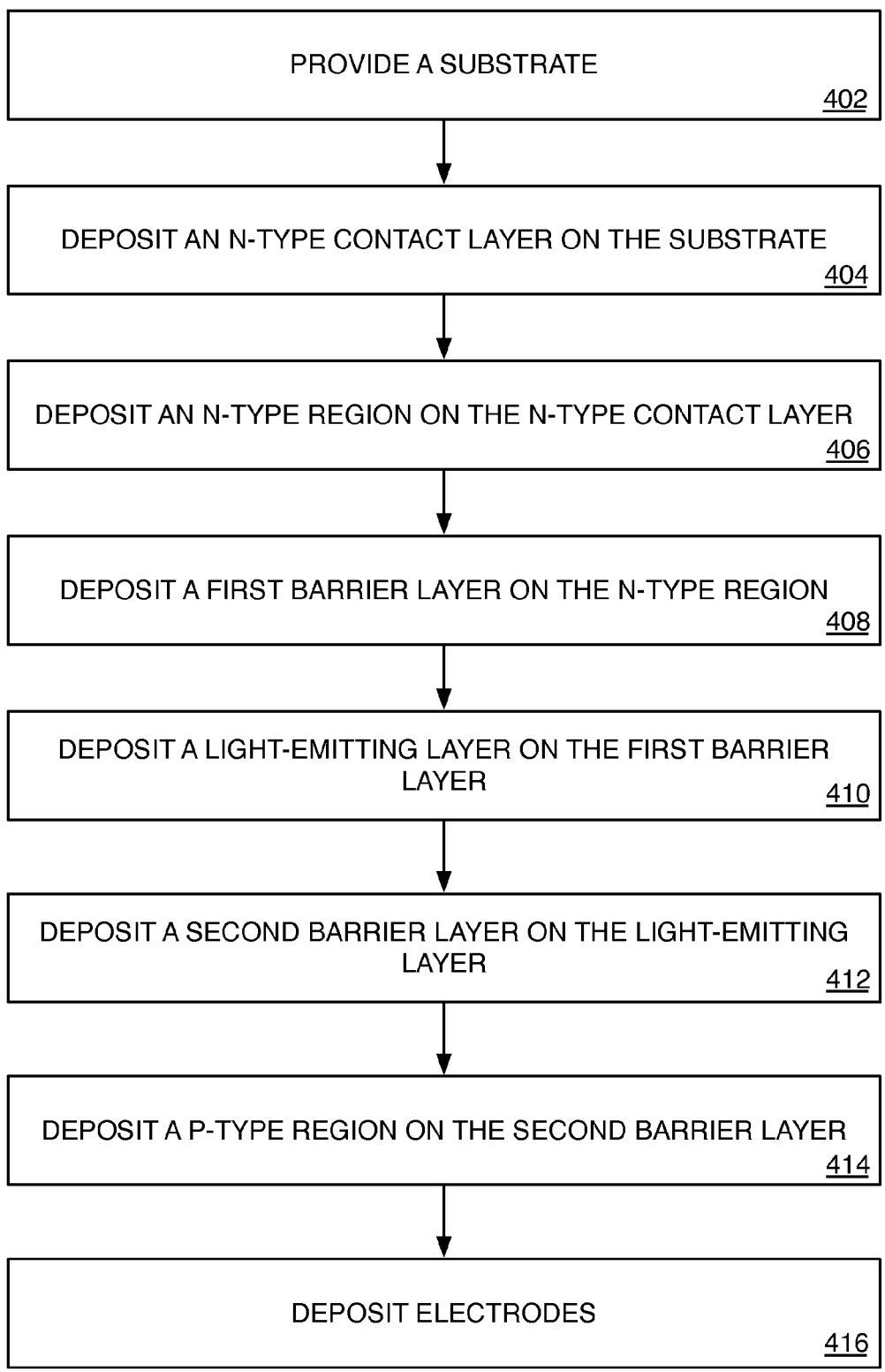
FIG. 4 is a flow diagram of an illustrative embodiment of a process for generating light-emitting device structures arranged in accordance with the present disclosure.

FIG. 4 is a flow diagram of an illustrative embodiment of a process 400 for generating light-emitting device structures. Process 400, and other processes described herein, set forth various functional blocks or actions that may be described as processing steps, functional operations, events and/or acts, etc. Those skilled in the art in light of the present disclosure will recognize that numerous alternatives to the functional blocks shown in FIG. 4 may be practiced in various implementations. For example, although process 400, as shown in FIG. 4, includes one particular order of blocks or actions, the order in which these blocks or actions are presented does not necessarily limit the claimed subject matter to any particular order. Likewise, intervening actions not shown in FIG. 4 and/or additional actions not shown in FIG. 4 may be employed and/or some of the actions shown in FIG. 4 may be eliminated, without departing from the scope of the claimed subject matter.

In block 402, a substrate may be provided. In block 404, an n-type contact layer may be deposited on the substrate. The n-type contact layer may be deposited via molecular beam epitaxy (MBE), metal organic chemical vapor deposition (MOCVD), hydride vapor phase epitaxy (HVPE), atomic layer epitaxy (ALE), and/or the like. In block 406, an n-type region may be deposited on the n-type contact layer. The n-type region may be deposited via MBE, MOCVD, HVPE, ALE, and/or the like. In block 408, a first barrier layer may be deposited on the n-type region. The first barrier layer may be deposited via MBE, MOCVD, HVPE, ALE, and/or the like.

In block 410, a semiconductor light-emitting layer may be deposited on the first barrier layer. The semiconductor light-emitting layer may be deposited via MBE, MOCVD, HVPE, ALE, and/or the like. In block 412, a second barrier layer may be deposited on the semiconductor light-emitting layer. The second barrier layer may be deposited via MBE, MOCVD, HVPE, ALE, and/or the like. The semiconductor light-emitting layer may include a first semiconductor material and the first and second barrier layers may include a second semiconductor material. In an example, a quantum well may include a double heterostructure where a semiconductor light-emitting layer of a first semiconductor material is sandwiched between two barrier layers of a second semiconductor material. For example, one such double heterostructure may include a semiconductor light-emitting layer of a first semiconductor material including a copper blend I-VII compound semiconductor layer (e.g. CuCl, CuBr, or CuI) sandwiched between two barrier layers of a second semiconductor material including a copper blend I-VII compound semiconductor material (e.g. CuIBrCl or CuICl).

In block 414, a p-type region may be deposited on the second barrier layer. The p-type region may be deposited via MBE, MOCVD, HVPE, ALE, and/or the like. The n-type region and the p-type region may define a p-n junction capable of injecting charge carriers into the semiconductor light-emitting layer. In block 416, one or more electrodes may be deposited. For example, a transparent electrode may be deposited on the p-type region. Additionally, a metal electrode may be deposited on the n-type contact layer (or alternatively on the n-type region).

Figure 5:
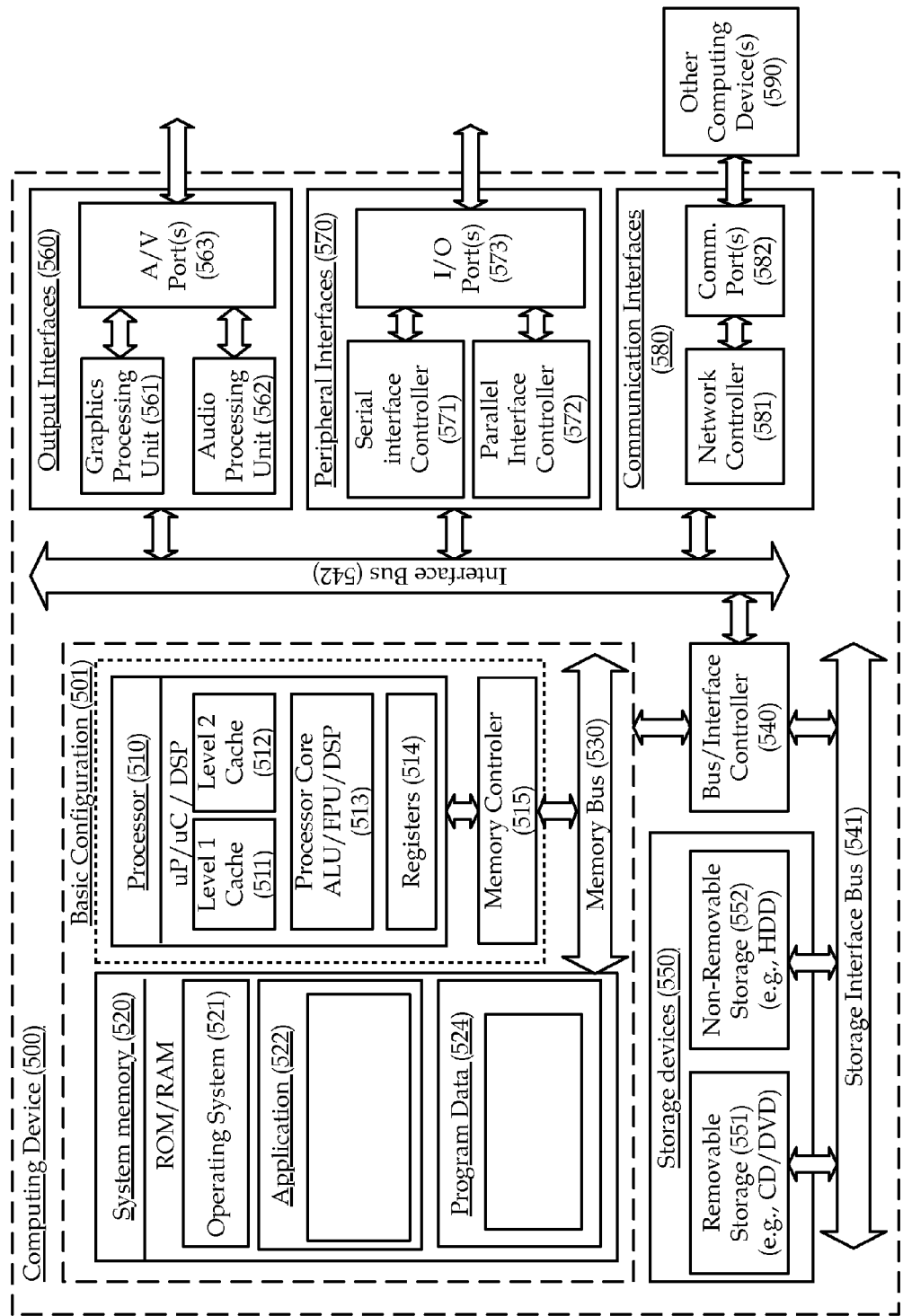
FIG. 5 is a block diagram of an illustrative embodiment of a computing device arranged in accordance with the present disclosure.
Figure 4:
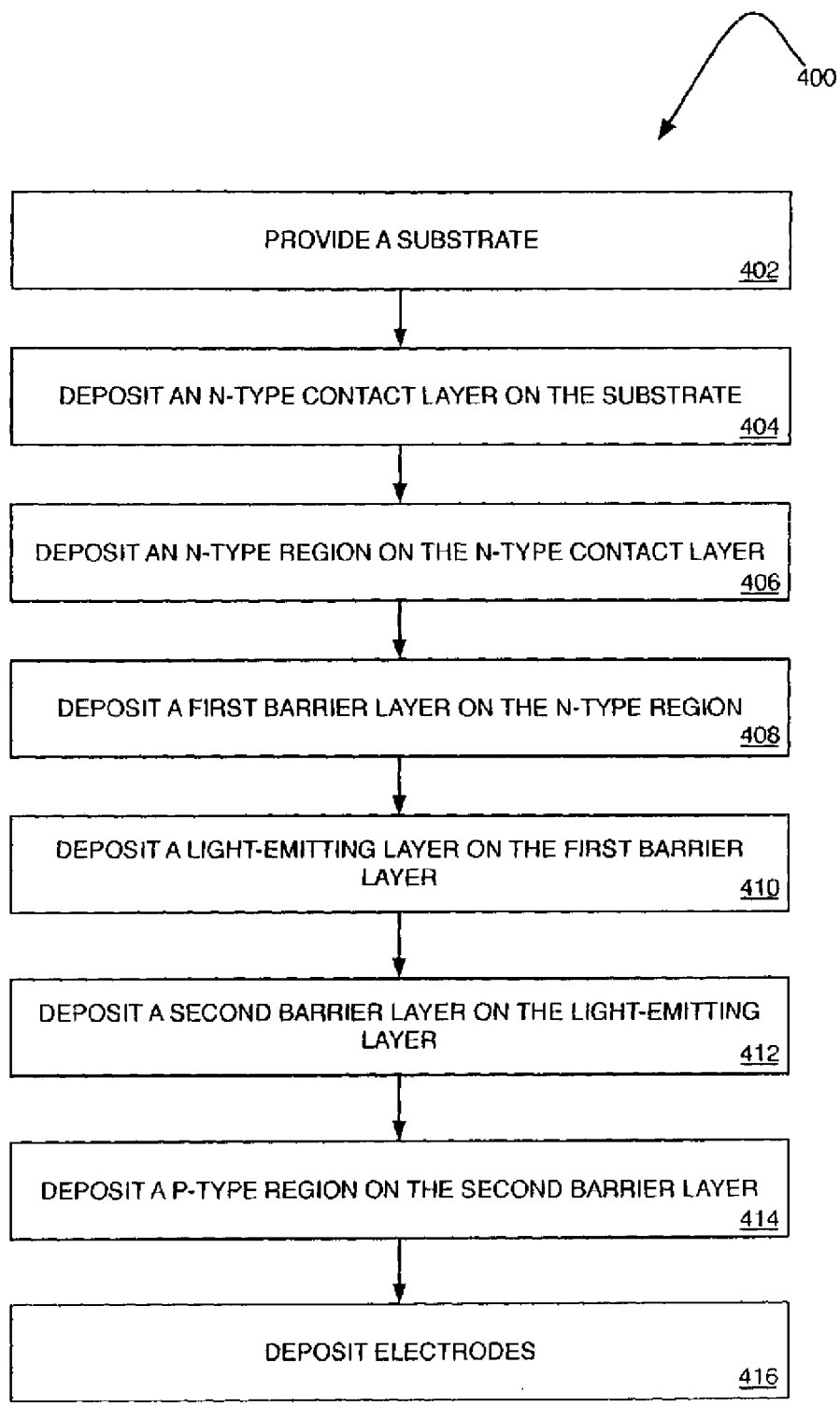
Figure 5:
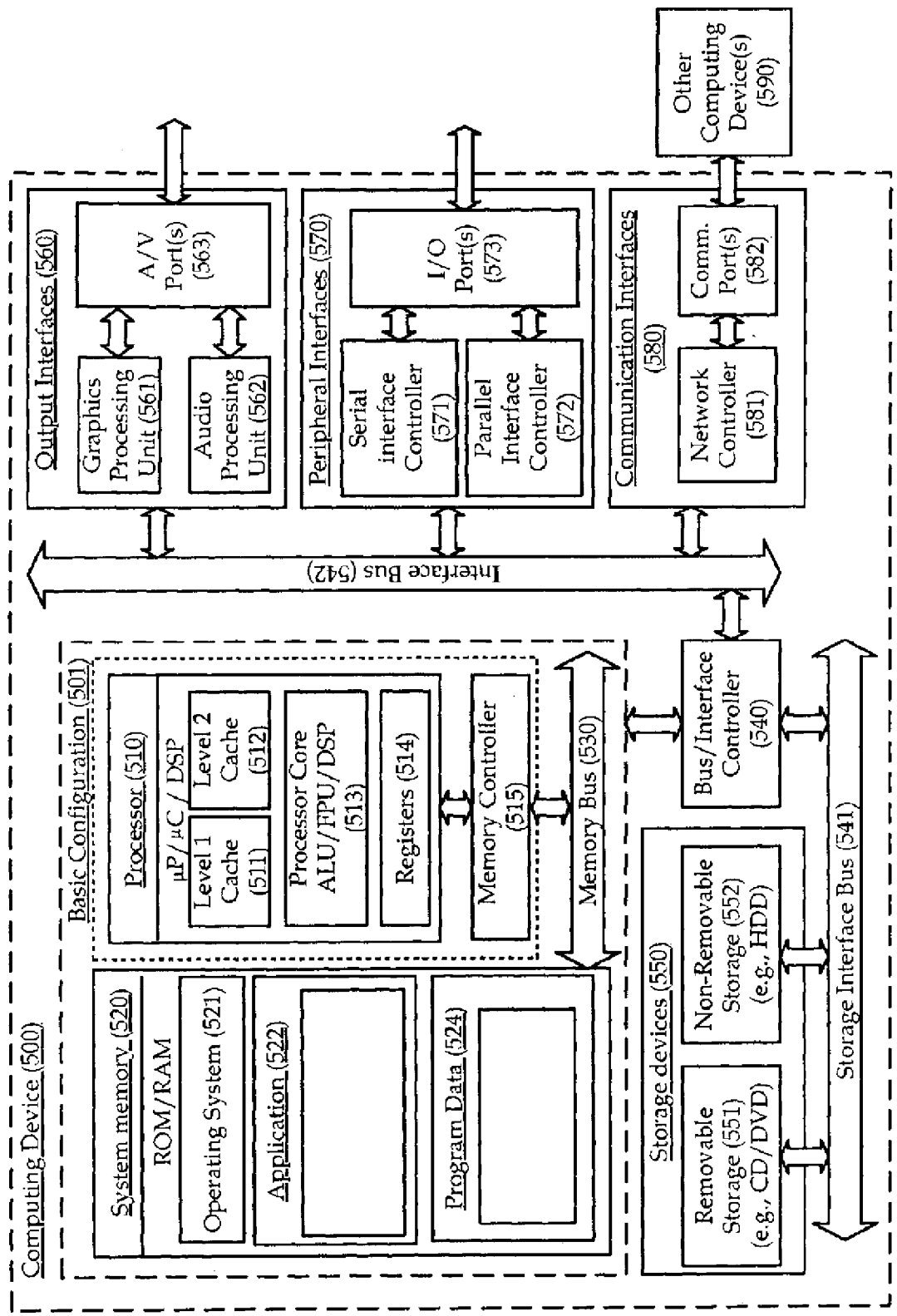

FIG. 5 is a block diagram of an illustrative embodiment of computing device 500 that is arranged to generate light-emitting device structures, in accordance with the present disclosure. In one example basic configuration 501, computing device 500 may include one or more processors 510 and a system memory 520. A memory bus 530 can be used for communicating between the processor 510 and the system memory 520.

Depending on the desired configuration, processor 510 may be of any type including but not limited to a microprocessor (μP), a microcontroller (μC), a digital signal processor (DSP), or any combination thereof. Processor 510 can include one or more levels of caching, such as a level one cache 511 and a level two cache 512, a processor core 513, and registers 514. Processor core 513 can include an arithmetic logic unit (ALU), a floating point unit (FPU), a digital signal processing core (DSP Core), or any combination thereof. A memory controller 515 can also be used with processor 510, or in some implementations memory controller 515 can be an internal part of processor 510.

Depending on the desired configuration, system memory 520 may be of any type including but not limited to volatile memory (such as RAM), non-volatile memory (such as ROM, flash memory, etc.) or any combination thereof. System memory 520 may include an operating system 521, one or more applications 522, and program data 524. In some example embodiments, application 522 may be arranged to operate with program data 524 on an operating system to generate light-emitting device structures, for example, as described above with respect to process 400 of FIG. 4. This described basic configuration is illustrated in FIG. 5 by those components within the dashed line enclosing basic configuration 501.

Computing device 500 may have additional features or functionality, and additional interfaces to facilitate communications between basic configuration 501 and any required devices and interfaces. For example, a bus/interface controller 540 may be used to facilitate communications between basic configuration 501 and one or more data storage devices 550 via a storage interface bus 541. Data storage devices 550 may be removable storage devices 551, non-removable storage devices 552, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 520, removable storage 551 and non-removable storage 552 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 500. Any such computer storage media may be part of device 500.

Computing device 500 may also include an interface bus 542 for facilitating communication from various interface devices (e.g., output interfaces, peripheral interfaces, and communication interfaces) to basic configuration 501 via bus/interface controller 540. Example output interfaces 560 may include a graphics processing unit 561 and an audio processing unit 562, which may be configured to communicate to various external devices such as a display or speakers via one or more A/V ports 563. Example peripheral interfaces 570 may include a serial interface controller 571 or a parallel interface controller 572, which may be configured to communicate with external devices such as input devices (e.g., keyboard, mouse, pen, voice input device, touch input device, etc.) or other peripheral devices (e.g., printer, scanner, etc.) via one or more I/O ports 573. An example communication interface 580 includes a network controller 581, which may be arranged to facilitate communications with one or more other computing devices 590 over a network communication via one or more communication ports 582. A communication connection is one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR) and other wireless media. The term computer readable media as used herein may include both storage media and communication media.

Computing device 500 may be implemented as a portion of a small-form factor portable (or mobile) electronic device such as a cell phone, a personal data assistant (PDA), a personal media player device, a wireless web-watch device, a personal headset device, an application specific device, or a hybrid device that includes any of the above functions. Computing device 500 may also be implemented as a personal computer including both laptop computer and non-laptop computer configurations. In addition, computing device 500 may be implemented as part of a wireless base station or other wireless system or device.

Some portions of the foregoing detailed description are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing device, that manipulates or transforms data represented as physical electronic or magnetic quantities within memories, registers, or other information storage devices, transmission devices, or display devices of the computing device.

Claimed subject matter is not limited in scope to the particular implementations described herein. For example, some implementations may be in hardware, such as employed to operate on a device or combination of devices, for example, whereas other implementations may be in software and/or firmware. Likewise, although claimed subject matter is not limited in scope in this respect, some implementations may include one or more articles, such as a signal bearing medium, a storage medium and/or storage media. This storage media, such as CD-ROMs, computer disks, flash memory, or the like, for example, may have instructions stored thereon, that, when executed by a computing device, such as a computing system, computing platform, or other system, for example, may result in execution of a processor in accordance with claimed subject matter, such as one of the implementations previously described, for example. As one possibility, a computing device may include one or more processing units or processors, one or more input/output devices, such as a display, a keyboard and/or a mouse, and one or more memories, such as static random access memory, dynamic random access memory, flash memory, and/or a hard drive.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a flexible disk, a hard disk drive (HDD), a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

Claimed subject matter is not limited in scope to the particular implementations described herein. Reference in the specification to "an implementation," "one implementation," "some implementations," "other implementations," "one embodiment," "some embodiments," "other embodiments," "an example," "some examples," "various examples," or "other examples" may mean that a particular feature, structure, or characteristic described in connection with one or more implementations, embodiments or examples may be included in at least some implementations, embodiments or examples, but not necessarily in all implementations, embodiments or examples. The various appearances of "an implementation," "one implementation," "some implementations," "one embodiment," "some embodiments," "other embodiments," "an example," "some examples," "various examples," or "other examples" in the preceding description are not necessarily all referring to the same implementations, embodiments or examples.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claimed subject matter containing only one such recitation, even when the same claim includes the introductory phrases "one or more" or "at least one" and indefinite articles such as "a" or "an" (e.g., "a"

and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges, which can be subsequently broken down into subranges as discussed above.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of making a semiconductor light-emitting device comprising:
   depositing an n-type contact layer on a substrate;
   depositing an n-type region on the n-type contact layer;
   depositing a first barrier layer on the n-type region;
   depositing a copper blend I-VII compound semiconductor light-emitting layer on the first barrier layer;
   depositing a second barrier layer on the copper blend I-VII compound semiconductor light-emitting layer;
   depositing a p-type region on the second barrier layer; and
   depositing an electrode, wherein:
   at least one of the first barrier layer or the second barrier layer includes a copper blend I-VII compound semiconductor material.

2. The method of claim 1, wherein at least one of the first barrier layer or second barrier layer comprises a quaternary copper blend I-VII compound semiconductor material.

3. The method of claim 1, wherein at least one of the first barrier layer or second barrier layer comprises a CuIBrCl-type quaternary copper blend I-VII compound semiconductor material.

4. The method of claim 1, wherein at least one of the first barrier layer or second barrier layer comprises a ternary copper blend I-VII compound semiconductor material.

5. The method of claim 1, wherein at least one of the first barrier layer or second barrier layer comprises a CuICl-type copper blend I-VII compound semiconductor material.

6. The method of claim 1, wherein the copper blend I-VII compound semiconductor comprises CuCl, CuBr, CuI or combinations thereof.

7. The method of claim 1, wherein the n-type region and/or the p-type region comprises an I-VII compound semiconductor.

8. The method of claim 1, wherein the substrate comprises an Si(111) surface.

9. The method of claim 1, wherein the electrode comprises a transparent electrode.

10. The method of claim 1, further comprising:
    depositing a metal electrode on the n-type contact layer.

11. The method of claim 1, wherein at least one of the first barrier layer or the second barrier layer has a material composition adapted to cause a spontaneous polarization field and a piezoelectric polarization field in the copper blend I-VII compound semiconductor light-emitting layer to have opposite directions.

12. The method of claim 1, wherein the copper blend I-VII compound semiconductor comprises CuCl, CuBr, CuI or combinations thereof,
    wherein at least one of the first barrier layer or the second barrier layer comprises a CuIBrCl-type quaternary copper blend I-VII compound semiconductor material,
    wherein the n-type region and/or the p-type region comprises an I-VII compound semiconductor, wherein the substrate includes an Si(111) surface, and
wherein at least one of the first barrier layer or the second
   barrier layer has a material composition adapted to cause
   a spontaneous polarization field and a piezoelectric
   polarization field in the copper blend I-VII compound
   semiconductor light-emitting layer to have opposite
   directions.

* * * * *

UNITED STATES PATENT AND TRADEMARK OFFICE
CERTIFICATE OF CORRECTION

Page 1 of 4

PATENT NO.         : 8,524,517 B2
APPLICATION NO.    : 13/279945
DATED              : September 3, 2013
INVENTOR(S)        : Ahn It is certified that error appears in the above-identified patent and that said Letters Patent is hereby corrected as shown below:

On the Title Page, in Item (52), under "U.S. Cl.", in Column 1, Line 2, delete "257/96" and insert -- 257/96; 257/103; 257/E29.102; 257/E33.037 --, therefor.

On Title Page 2, in Item (56), under "OTHER PUBLICATIONS", in Column 1, Line 21, delete "pp. 520-526, pp. 520-526." and insert -- pp. 520-526. --, therefor.

On Title Page 2, in Item (56), under "OTHER PUBLICATIONS", in Column 2, Line 9, delete "al," and insert -- al., --, therefor.

On Title Page 2, in Item (56), under "OTHER PUBLICATIONS", in Column 2, Line 71, delete "Voume:" and insert -- Volume: --, therefor.

On Title Page 3, in Item (56), under "OTHER PUBLICATIONS", in Column 1, Line 42, delete "GaN/AIGaN" and insert -- GaN/AlGaN --, therefor.

On Title Page 3, in Item (56), under "OTHER PUBLICATIONS", in Column 1, Line 48, delete "InGaN/InGaAIN" and insert -- InGaN/InGaAlN --, therefor.

On Title Page 3, in Item (56), under "OTHER PUBLICATIONS", in Column 2, Line 4, delete "InGaN/InGaAIN" and insert -- InGaN/InGaAlN --, therefor.

On Title Page 3, in Item (56), under "OTHER PUBLICATIONS", in Column 2, Line 11, delete "CuI" and insert -- CuI --, therefor.

On Title Page 3, in Item (56), under "OTHER PUBLICATIONS", in Column 2, Line 22, delete "al," and insert -- al., --, therefor.

On Title Page 3, in Item (56), under "OTHER PUBLICATIONS", in Column 2, Line 24, delete "al," and insert -- al., --, therefor.

Signed and Sealed this
Twenty-second Day of April, 2014

Michelle K. Lee
*Deputy Director of the United States Patent and Trademark Office*

CERTIFICATE OF CORRECTION (continued)
U.S. Pat. No. 8,524,517 B2

On Title Page 3, in Item (56), under "OTHER PUBLICATIONS", in Column 2, Line 37, delete "superlatttices" and insert -- superlattices --, therefor.

In the Drawings

In Fig. 4, Sheet 4 of 5, delete " 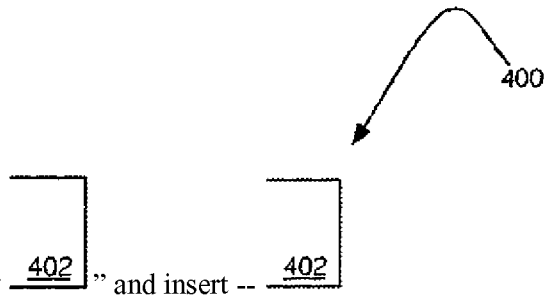 " and insert -- -- , therefor, see attached Page 3, fig. 4.

In Fig. 5, Sheet 5 of 5, delete "uP/uC/DSP" and insert -- $\mu P/\mu C/DSP$ --, therefor, see attached Page 4, Fig. 5.

In Fig. 5, Sheet 5 of 5, in Box "(515)", in Line 1, delete "Controler" and insert -- Controller --, therefor.

In the Specification

In Column 6, Line 29, delete "(In2O3) and tin (IV) oxide (SnO2))," and insert -- ($In_2O_3$) and tin (IV) oxide ($SnO_2$)), --, therefor.

In Column 11, Line 33, delete "and or" and insert -- and/or --, therefor.